US012812788B2

(12) United States Patent
Lim et al.

(10) Patent No.: US 12,812,788 B2
(45) Date of Patent: Nov. 24, 2026

(54) SPACE-SAVING BACKPLATE ASSEMBLY FOR A COMPRESSION ATTACHED MEMORY MODULE AND METHOD FOR MOUNTING THE SAME

(71) Applicant: Intel Corporation, Santa Clara, CA (US)

(72) Inventors: Min Suet Lim, Gelugor (MY); Jeff Ku, Taipei City (TW); Smit Kapila, Bangalore (IN); Shantanu Kulkarni, Hillsboro, OR (US); Arturo Navarro Alvarez, San Isidro de Grecia (CR); Surya Pratap Mishra, Portland, OR (US)

(73) Assignee: Intel Products IP LLC, Santa Clara, CA (US)

( * ) Notice: Subject to any disclaimer, the term of this patent is extended or adjusted under 35 U.S.C. 154(b) by 244 days.

(21) Appl. No.: 18/679,472

(22) Filed: May 31, 2024

(65) Prior Publication Data

US 2025/0374433 A1 Dec. 4, 2025

(51) Int. Cl.
*H05K 1/181* (2026.01)
*G11C 5/04* (2006.01)

(52) U.S. Cl.
CPC ............... *H05K 1/181* (2013.01); *G11C 5/04* (2013.01); *H05K 2201/10159* (2013.01); *H05K 2201/10189* (2013.01); *H05K 2201/1059* (2013.01)

(58) Field of Classification Search
CPC .... H05K 1/14; H05K 1/141–144; H05K 1/18; H05K 1/181–187; H05K 2201/1059; H05K 2201/10159; H05K 2201/10189; G01C 5/04
USPC ......... 361/690–710, 760–764, 782–784, 803
See application file for complete search history.

(56) References Cited

U.S. PATENT DOCUMENTS 6,930,884 B2 * 8/2005 Cromwell ................ H05K 7/12 361/709
7,755,895 B2 * 7/2010 Ikeda .................... H10W 40/10 257/713
9,382,938 B2 * 7/2016 Hayashi .................. F16B 43/00
10,959,319 B2 * 3/2021 Ma ........................ H05K 1/0206
2004/0066627 A1 * 4/2004 Liu ........................ H10W 40/60 257/E23.083
2007/0217162 A1 * 9/2007 Zhou ...................... H10W 40/43 257/E23.084
2020/0411495 A1 * 12/2020 Hovis ...................... G06F 1/183
(Continued)

*Primary Examiner* — Tuan T Dinh
(74) *Attorney, Agent, or Firm* — Viering, Jentschura & Partner mbB

(57) ABSTRACT

Disclosed herein is a backplate assembly for mounting a component (such as a compression attached memory module (CAMM)) and a co-located component (such as a solid state drive (SSD)) to a printed circuit board (PCB). The backplate assembly includes a backplate mounted on a first face of the PCB and attached to the component on a second face of the PCB that is opposite to the first face. The backplate includes a cutout to receive the co-located component and a perimeter portion that includes a flange extending away from the backplate and the printed circuit board. The backplate assembly also includes a plate cap configured to engage with the flange to attach the plate cap to the backplate and to at least partially cover the co-located component. Further disclosed is a method for mounting components on a PCB.

19 Claims, 9 Drawing Sheets

(56) References Cited

U.S. PATENT DOCUMENTS

| | | | | |
|---|---|---|---|---|
| 2022/0391007 | A1 * | 12/2022 | Lim | G06F 1/3275 |
| 2023/0005882 | A1 * | 1/2023 | Vergis | H10W 90/00 |
| 2023/0012759 | A1 * | 1/2023 | Chiappe | H05K 3/368 |
| 2023/0253723 | A1 * | 8/2023 | Kan | H01R 13/426<br>439/79 |

* cited by examiner

SPACE-SAVING BACKPLATE ASSEMBLY FOR A COMPRESSION ATTACHED MEMORY MODULE AND METHOD FOR MOUNTING THE SAME

TECHNICAL FIELD

The disclosure relates generally to components mounted on printed circuit boards (PCBs), and in particular, to a space-saving backplate assembly for mounted components such as a compression attached memory module (CAMM).

BACKGROUND

In compact computer designs—such as small-profile laptops, handhelds, compact desktops, and tablets—numerous components must fit within the housing. Components such as the motherboard (also called a PCB), cooling fan(s), batteries, connectors, antennas, cables, speakers, etc., must all fit within a small housing, making internal space a premium. In order to keep the motherboard as small as possible, both sides of the motherboard are often used for component placement so that the placement area is maximized. However, with some types of components, such as a compression attached memory module (a CAMM or a low power CAMM (LPCAMM)), such components may be a multipart assembly, where a main component is mounted on one side of the PCB and a mounting bracket/plate is on the opposite side of the PCB. Often, screws are fed through the PCB to secure the main component to the mounting bracket in order to stably mount the component to the PCB. For example, screws may be used to press and hold in place a CAMM against a set of land grid array pin contacts which provide electrical signal connections to the motherboard. Due to the pressure needed for pressing and holding the CAMM in place against the pin contacts, a mounting bracket is often required on the opposite side of the motherboard in order to avoid stressing/bending the motherboard. The mounting bracket, however, takes up valuable motherboard space on the opposite side of the PCB from the CAMM.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary aspects of the disclosure are described with reference to the following drawings, in which.

DESCRIPTION

Figure 1:
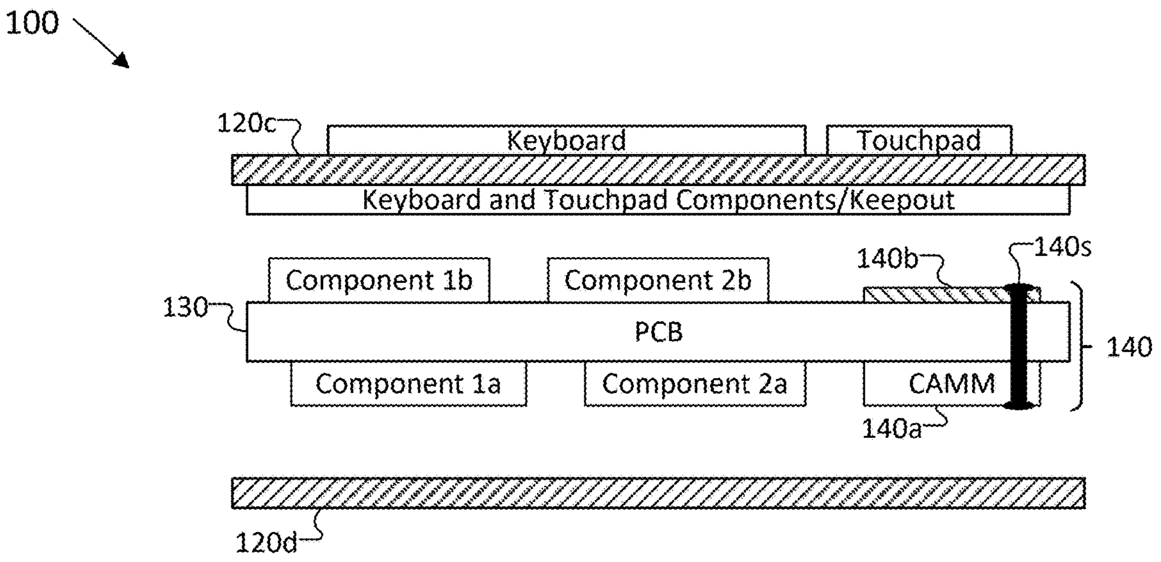
FIG. 1 shows an example of a schematic cross-sectional view of a lower portion of typical clamshell laptop that may house a PCB to which a CAMM assembly may be mounted.

The following detailed description refers to the accompanying drawings that show, by way of illustration, exemplary details and features.

The word “exemplary” is used herein to mean “serving as an example, instance, or illustration.” Any aspect or design described herein as “exemplary” is not necessarily to be construed as preferred or advantageous over other aspects or designs.

Throughout the drawings, it should be noted that like reference numbers are used to depict the same or similar elements, features, and structures, unless otherwise noted.

The phrase “at least one” and “one or more” may be understood to include a numerical quantity greater than or equal to one (e.g., one, two, three, four, [ . . . ], etc.). The phrase “at least one of” with regard to a group of elements may be used herein to mean at least one element from the group consisting of the elements. For example, the phrase “at least one of” with regard to a group of elements may be used herein to mean a selection of: one of the listed elements, a plurality of one of the listed elements, a plurality of individual listed elements, or a plurality of a multiple of individual listed elements.

The words “plural” and “multiple” in the description and in the claims expressly refer to a quantity greater than one. Accordingly, any phrases explicitly invoking the aforementioned words (e.g., “plural [elements]”, “multiple [elements]”) referring to a quantity of elements expressly refers to more than one of the said elements. For instance, the phrase “a plurality” may be understood to include a numerical quantity greater than or equal to two (e.g., two, three, four, five, [ . . . ], etc.).

The phrases “group (of)”, “set (of)”, “collection (of)”, “series (of)”, “sequence (of)”, “grouping (of)”, etc., in the description and in the claims, if any, refer to a quantity equal to or greater than one, i.e., one or more. The terms “proper subset”, “reduced subset”, and “lesser subset” refer to a subset of a set that is not equal to the set, illustratively, referring to a subset of a set that contains less elements than the set.

The term “data” as used herein may be understood to include information in any suitable analog or digital form, e.g., provided as a file, a portion of a file, a set of files, a signal or stream, a portion of a signal or stream, a set of signals or streams, and the like. Further, the term “data” may also be used to mean a reference to information, e.g., in the form of a pointer. The term “data”, however, is not limited to the aforementioned examples and may take various forms and represent any information as understood in the art.

The terms “processor” or “controller” as, for example, used herein may be understood as any kind of technological entity (e.g., hardware, software, and/or a combination of both) that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, software, firmware, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As used herein, “memory” is understood as a computer-readable medium (e.g., a non-transitory computer-readable medium) in which data or information can be stored for retrieval. References to “memory” included herein may thus be understood as referring to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term “software” refers to any type of executable instruction, including firmware.

As noted above, both sides of a PCB are often used for component placement so as to maximize the available placement area on a PCB while keeping the PCB’s dimensions small. However, components such as a compression attached memory module (a CAMM or a low power LPCAMM) may be a multipart assembly, where a main component is mounted on one side of the PCB and joined via screw(s) through the PCB to a mounting bracket/plate on the opposite side of the PCB. Unfortunately, because the mounting bracket takes up space on the opposite side of the PCB, the placement area opposite to the CAMM is reduced.

FIG. 1 depicts an example schematic cross-sectional view 100 of a lower portion of typical clamshell laptop that may house a PCB to which a CAMM assembly may be mounted. As should be understood, the schematic of FIG. 1 is not to scale, does not include all the parts of a laptop, and is merely a sketch meant to show the general nature of how a motherboard may be located in the limited space within the confines a computer’s housing.

As is typical for the lower housing portion of clamshell laptops, the housing may be formed from a two-part clamshell housing design, where a c-cover 120*c* together with a d-cover 120*d* define an interior for housing electronic circuitry, fans, batteries, connectors, etc. within the lower portion of the laptop. Typically, the outer surface of the c-cover 120*c* exposes a keyboard and touchpad for use by the user that connect to other circuitry within the interior of the housing (e.g., below the c-cover 120*c* and above d-cover 120*d*). In particular, circuit boards (e.g., a motherboard and/or other PCBs), cooling fan(s), batteries, connectors, antennas, cables, speakers, etc. may be located within the interior of the housing.

For example, in FIG. 1, a PCB 130 (also referred to as a motherboard, circuit board, etc.) is within the housing. Attached to PCB 130 are typically a number of components, mounted on both sides of the PCB 130 to maximize placement area. In the example of FIG. 1, components 1*a* and 2*a* are on one side (the “a” side) of PCB 130 while components 1*b* and 2*b* are located on the other side (the “b” side”) of PCB 130. Also attached to PCB 130 is a CAMM assembly 140 that includes a CAMM 140*a* (on the “a” side) attached via screws 140*s* to backplate 140*b* (on the “b” side) through PCB 130. The backplate 140*b* may provide mounting support so that when the screws 140*s* are tightened to press and hold the CAMM in place, PCB 130 is not overly stressed/bent. As illustrated in FIG. 1, backplate 140*b* takes up valuable placement real estate on the “b” side of PCB 130 and no other components may be mounted where backplate 140*b* is located.

Figure 2:
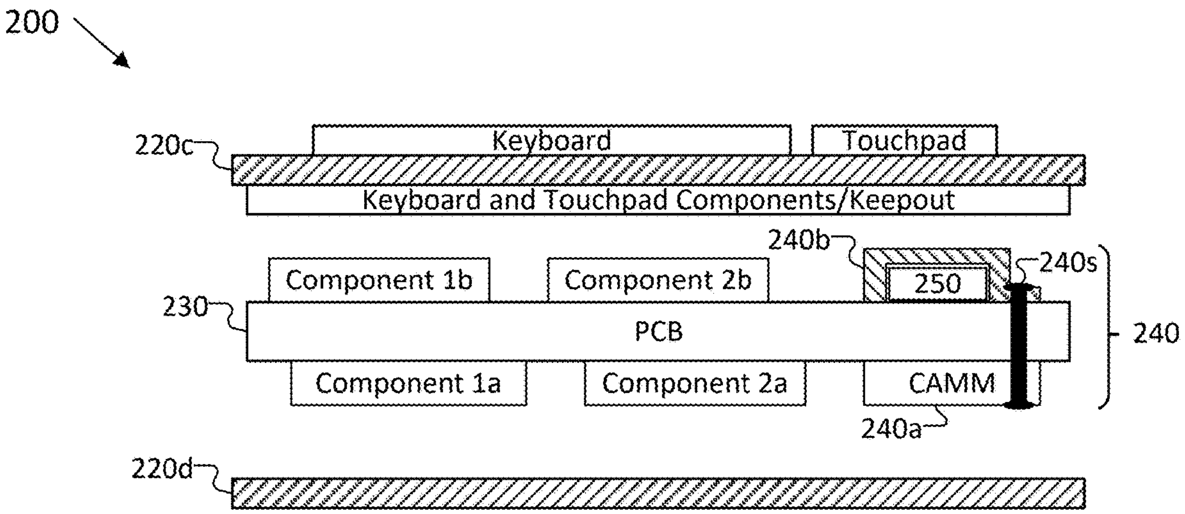
FIG. 2 shows an example of a simplified view of a mounting assembly for components such as a CAMM, where the backplate provides mounting space in which an additional component may be co-located and mounted to the PCB.

Disclosed in more detail below is an improved mounting assembly for components such as a CAMM, where the backplate provides mounting space (e.g., a cutout) in which an additional component may be co-located and mounted to the PCB. A simplified view of such a mounting assembly is shown in FIG. 2, which shows, similar to FIG. 1, a cross-sectional view 200 of a lower portion of typical clamshell laptop that may house a PCB to which a CAMM assembly may be mounted. Like FIG. 1, the cross-section of FIG. 2 shows a PCB 230 located within the housing space between c-cover 220*c* and the d-cover 220*d*. Mounted to PCB 230 are components 1*b* and 2*b* to side “b” of PCB 230, and components 1*a* and 2*a* are mounted to side “a” of PCB 230. PCB 230 also includes a CAMM assembly 240. CAMM assembly 240 includes a CAMM 240*a* (on the “a” side) attached via screws 240*s* to backplate 240*b* (on the “b” side) through PCB 230. Unlike backplate 140*b* of FIG. 1, backplate 240*b* of FIG. 2 provides space for attaching an additional component to PCB 230. As shown in FIG. 2, backplate 240*b* accommodates the mounting of component 250 to the “b” side of PCB 230, where component 250 may be co-located with the backplate 240*b* on the opposite side of the PCB 230 from CAMM 240*a*. In addition to saving space on the motherboard to accommodate a co-located component, the backplate 240*b* may also include a heat spreader that may thermally connect to and may conduct heat away from the co-mounted component. As should be appreciated, backplate 240*b* of FIG. 2 is not drawn to scale and does not show all the features of the space-saving backplate disclosed herein. More details of the improved backplate and its advantages are discussed in more detail below.

Figure 3:
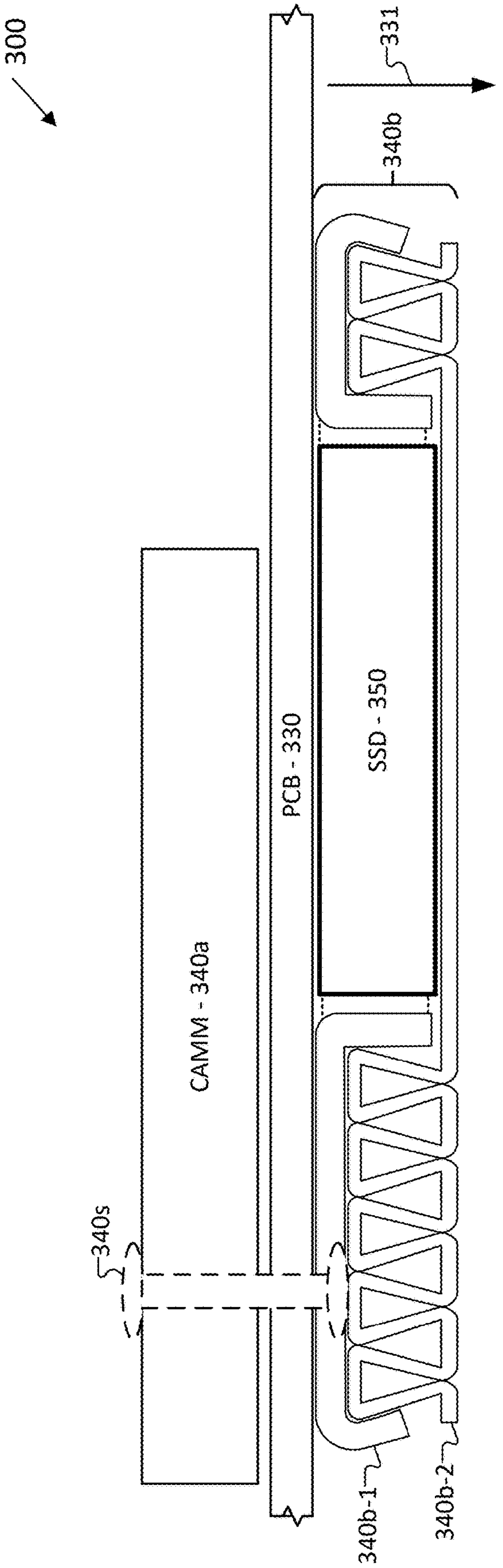
FIG. 3 illustrates a more detailed cross-sectional view of a PCB on which a CAMM may mounted using a backplate assembly that accommodates an additional, co-located component.

FIG. 3 shows a more detailed cross-sectional view 300 of a PCB (e.g., PCB 330) on which a CAMM assembly (e.g., 340*a*, 340*b*, and 340*s*; collectively CAMM assembly 340) is mounted. CAMM assembly 340 may include a CAMM

340*a*, a backplate assembly 340*b* (also referred to as a mounting assembly or simply a backplate), and a screw(s) or other mounting device(s) 340*s* that connect the CAMM 340*a* to the backplate assembly 340*b* through PCB 330. In particular, the backplate assembly 340*b* may include multiple parts: a backplate 340*b*-1 (also referred to as a plate) and a plate cap 340*b*-2 (also referred to as a heat spreader). As illustrated in FIG. 3, a cutout in the backplate 340*b*-1 is sized to accommodate an additional component (e.g., a solid state drive (SSD) such as SSD 350) that may be mounted to PCB 330 at the same location as the backplate assembly 340*b*. The plate cap 340*b*-2 is also sized to accommodate and cover SSD 350. As should be appreciated, while a solid state drive (e.g., an M.2SSD) is used here as an example component throughout this disclosure, it should be understood that the cutout of the backplate assembly 340*b* may be sized to accommodate any type, size, and form factor of additional component for co-locating with the backplate. Similarly, while a CAMM is used as an example throughout this disclosure as a type of component that is mounted with a backplate on the opposite side of a PCB, it should be understood that the disclosed backplate may be used with any type of component that is mounted to a PCB via a backplate on the opposite side of the PCB. As should be appreciated, the shape of the backplate, cutout for the co-located component, and plate cap may be adapted accordingly.

In the example of FIG. 3, the plate cap 340*b*-2 may be removably mounted to the backplate 340*b*-1 and may be retained by backplate 340*b*-1 in order to cover SSD 350 and hold it in place. Plate cap 340*b*-2 may a resilient body that thermally conducts (e.g., a heat spreader or a spring spreader made of plastic, metal, or other material) conduct heat between SSD 350 and backplate 340*b*-1. The backplate 340*b*-1 may also be a thermally conductive material that provides stiffening support for the PCB 330, such as metal. Such an arrangement of backplate assembly 340*b* may provide an efficient solution to provide additional placement space on PCB 330 while also providing additional thermal dissipation to SSD 350 (or other component accommodated by the backplate assembly 340*b*).

Backplate 340*b*-1 may be shaped with a cutout that accommodates the additional component (e.g., SSD 350) to be placed under the CAMM 340*a* without any modifications to the CAMM 340*a* itself (e.g., the interposer board, the CAMM shield, and the CAMM's method of attachment to the backplate). The locations of the three mounting screw bosses-typically required in a CAMM installation-need not be changed. In other words, the screw mounting locations defined by the CAMM mounting standard may be retained and the cutout may be dimensioned so as to preserve the screw locations defined by the CAMM mounting standard or other mounting standards.

For example, backplate 340*b*-1 may have a vertically raised wall(s) that help give structural stiffness to the backplate 340*b*-1 for reducing the deflecting/bending of PCB 330 when the CAMM 340*a* is tightly attached via mounting device 340*s* (e.g., screws). In addition, the vertically raised walls of backplate 340*b*-1 may be angled (e.g., a flange) in order to accommodate receiving and removably retaining the plate cap 340*b*-2. The angling of the raised wall(s) (in FIG. 2, this is shown on the outermost walls of backplate 340*b*-1) may help hold plate cap 340*b*-2 in place, which, in turn, may hold SSD 350 in place. As shown in FIG. 2, the walls extend away from the face of the backplate 340*b*-1 or the "b" side of PCB 330. The inner walls extend along the surface normal 331 while the outer walls are angled inwardly toward the cutout at an angle relative to the surface normal 331. The walls may be referred to as a flange and may be located along a perimeter (e.g., an outer extent and/or around the cutout) of backplate 340*b*-1.

Figure 4:
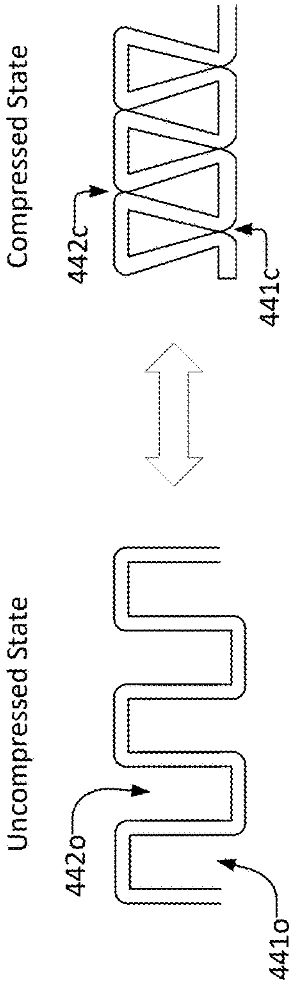
FIG. 4 depicts an example of a plate cap (spring spreader or heat spreader) in an uncompressed state and a compressed state.

Because plate cap 340*b*-2 may be resilient, it may be inserted and removed from its attachment to backplate 340*b*-1. This may be referred to as a snap-fit or a snap-in plate cap 340*b*-2, where plate cap 340*b*-2 may be resiliently deformable between a compressed state (when engaged with or snapped-in to backplate 340*b*-1) and an uncompressed state (when not engaged with or when removed from engagement with backplate 340*b*-1). FIG. 4 shows an example of an uncompressed state and a compressed state of the plate cap 340*b*-2.

Plate cap 340*b*-2 may be made from a continuous piece of material that has been preformed into fins, loops, or corrugation. The fins, loops, or corrugation may be non-patterned or a repeating pattern of contiguous shapes such as U-shapes, V-shapes, C-shapes, or any other type of shapes that open toward opposite faces of plate cap 340*b*-2. In the example of FIG. 3, plate cap 340*b*-2 is formed from a continuous piece of material with continuous open loops, wherein adjacent ones of the open loops open towards opposite faces of plate cap 340*b*-2. The continuous and opposite of the open loops may also be seen in FIG. 4, where, in the uncompressed state, opening 4410 is opposite to opening 4420. By using fins, loops, or corrugation, plate cap 340*b*-2 may provide air gaps for thermal conduction/dissipation (e.g., so that air may circulate through the spacing between adjacent fins, loops, or corrugation to transfer heat away from plate cap 340*b*-2. In addition, in the compressed state, the ends of the open loops may contact one another so as to provide a thermally conductive path along the extent of plate cap 340*b*-2, which may help improve thermal dissipation. The contacting of the ends of the open loops may be seen in FIG. 3 and in FIG. 4. In FIG. 4, for example, in the uncompressed state, the end of the loop at opening 441*c* contact one another and the ends of the loop at opening 442*c* contact one another. As should be appreciated, active cooling may be used to exchange the fluid (e.g., air) in the gaps formed between the fins, loops, and/or corrugations to further improve thermal dissipation.

Figure 5:
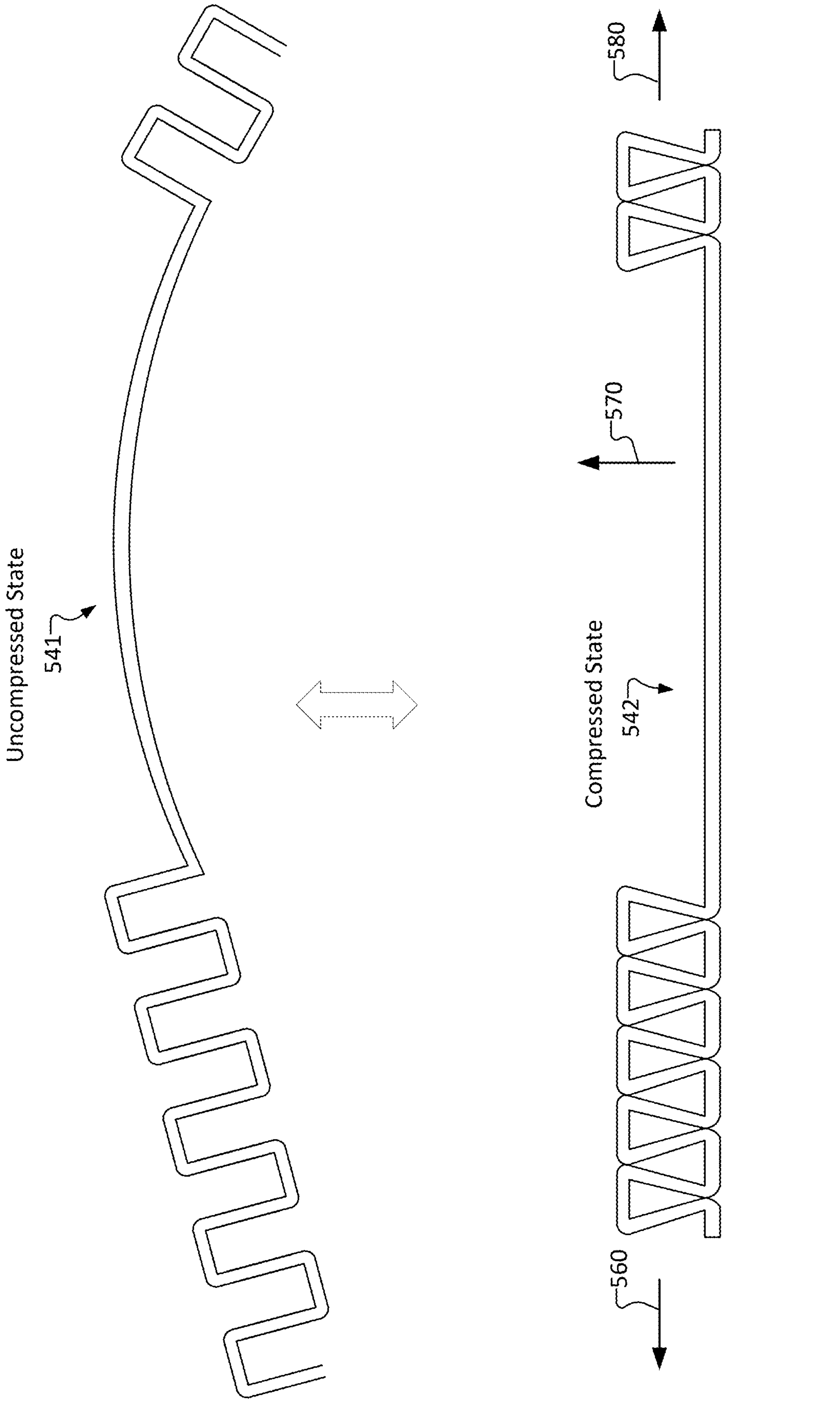
FIG. 5 shows an exemplary plate cap that may be precurved in the uncompressed state so as to provide additional forces to engage with the walls/flange of the backplate and to retain the additional component.

In addition, plate cap 340*b*-2 may be pre-curved in the uncompressed state so as to provide additional forces to engage with the walls/flange of the backplate 340*b*-1 and to retain SSD 350 when installed in the compressed state. An example of this is shown in FIG. 5, where the plate cap 340*b*-2 is shown in the uncompressed state 541, which is preformed with a curvature and in the compressed state 542. In the compressed state 542, additional forces 560, 570, and 580 may be provided (e.g., due to its tendency to return to the uncompressed state with a preformed curvature) the help engage with the walls/flange of the backplate and to retain the additional component. As should be understood, the preformed curvature of FIG. 5 is merely an example and any type of preforming may be used along with resiliency to provide advantageous forces for snap-in attachment with the backplate and/or for holding in place the additional component.

The additional thermal dissipation provided by the backplate assembly (e.g., backplate assembly 340*b* of FIG. 3) may help reduce the junction temperature of the additional component (e.g., of the SSD 350 of FIG. 3), allowing for it to operate at a higher speeds, longer life, and/or improved performance. Because the backplate makes space on the PCB (e.g., PCB 330) for an additional component (e.g. SSD 350), the size of the motherboard may be reduced and the housing space used for additional parts/features such as a larger battery, fans, etc. within the housing. In addition, the thermal dissipation provided by the backplate assembly may result in longer battery life as well as a cooler, quieter, and higher performing overall system. As should be appreciated, while the disclosed backplate assembly may be particularly advantageous for small laptop systems (e.g., under 14 inches), the backplate assembly may be used advantageously with any size/shape laptop or other computing form factor (smartphone, handheld, tablet, desktop computer, etc.).

The figures and accompanying description discussed below provide more non-limiting examples and/or different perspectives of the disclosed backplate assembly and corresponding features/advantages.

Figure 6:
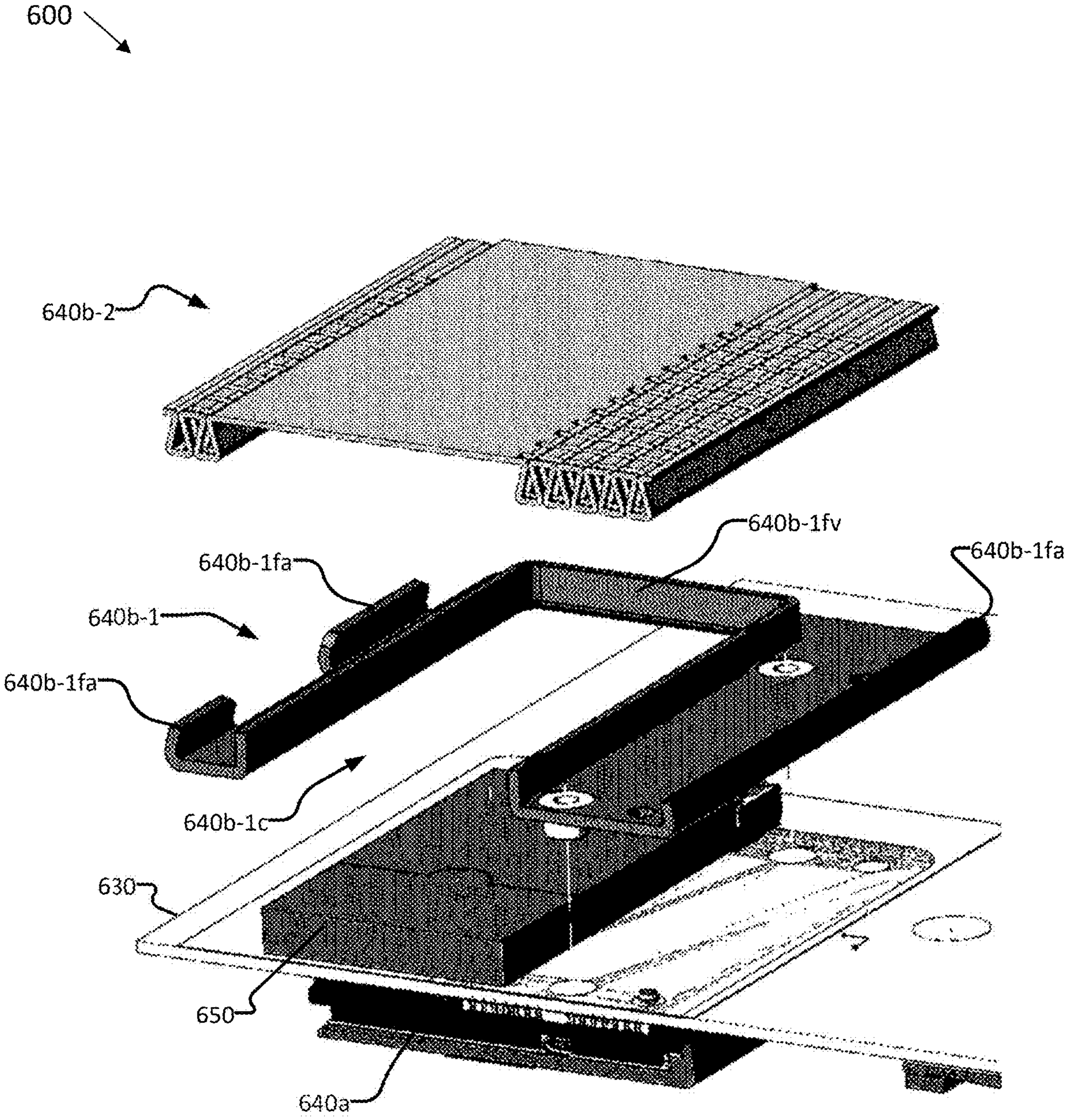
FIG. 6 shows an exploded stack view of a CAMM assembly that includes a CAMM and backplate assembly that accommodates a co-located component, where the backplate assembly includes a backplate and plate cap.

FIG. 6 shows an exploded stack view 600 of a CAMM assembly 640 (which includes CAMM 640*a* and backplate assembly 640*b* (which includes backplate 640*b*-1 and plate cap 640*b*-2)) being mounted onto a PCB 630. Backplate 640*b*-1 has walls or flanges (portions of which are annotated as 640*b*-1*fv* and as 640*b*-1*fa*) around its perimeter that extend away from PCB 630. In the example shown in FIG. 6, a cutout 640*b*-1*c* is cut out of the interior of the backplate 640*b*-1 so as to accommodate the co-located SSD 650 that is mounted on PCB 630. The walls of the backplate 640*b*-1 that partially surround the exterior-most perimeter of the backplate 640*b*-1 (a portion of which is annotated as 640*b*-1*fa*) are angled with respect to the surface normal, which may help provide a snap-in fit for and retention of the plate cap 640*b*-2. Though not annotated in FIG. 6, thermal insulation material (e.g., a pad, paste, or other thermally insulating material) may be placed between PCB 630 and backplate 640*b*-1 (and/or SSD 650).

Figure 7:
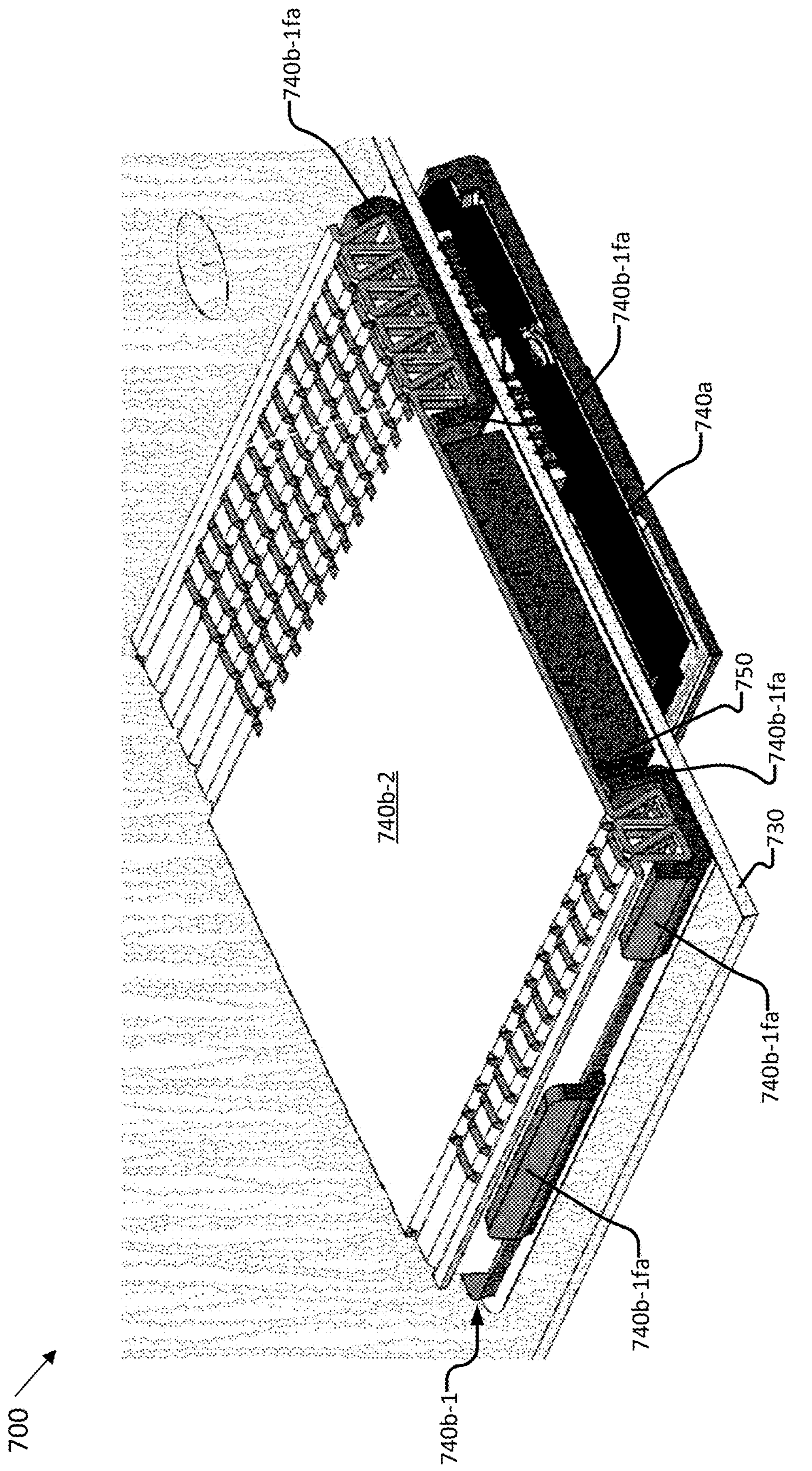
FIG. 7 shows a sideview (similar to the exploded stack view of FIG. 6, but in this case non-exploded and at a different angle) of a CAMM assembly that includes a CAMM and backplate assembly that accommodates a co-located component, where the backplate assembly includes a backplate and plate cap.

FIG. 7 shows a sideview 700 (similar to the exploded stack view 600 of FIG. 6, but in this case non-exploded) of a CAMM assembly 740 (which includes CAMM 740*a* and backplate assembly 740*b* (which includes backplate 740*b*-1 and plate cap 740*b*-2)) mounted onto a PCB 730 and accommodating an SSD 750 co-located with backplate assembly 740*b*. As seen in FIG. 7, backplate 740*b*-1 has walls or flanges (portions of which are annotated as 740*b*-1*fv* and as 740*b*-1*fa*) around its perimeter that extend vertically (740*b*-1*fv*) away from PCB 730 around the co-located SSD 750 and that extend an angle (740*b*-1*fa*) away from PCB 630 at the exterior-most perimeter of the backplate 740*b*-1. As mentioned earlier, this angling may help provide a snap-in fit for and retention of the plate cap 740*b*-2.

Figure 8:
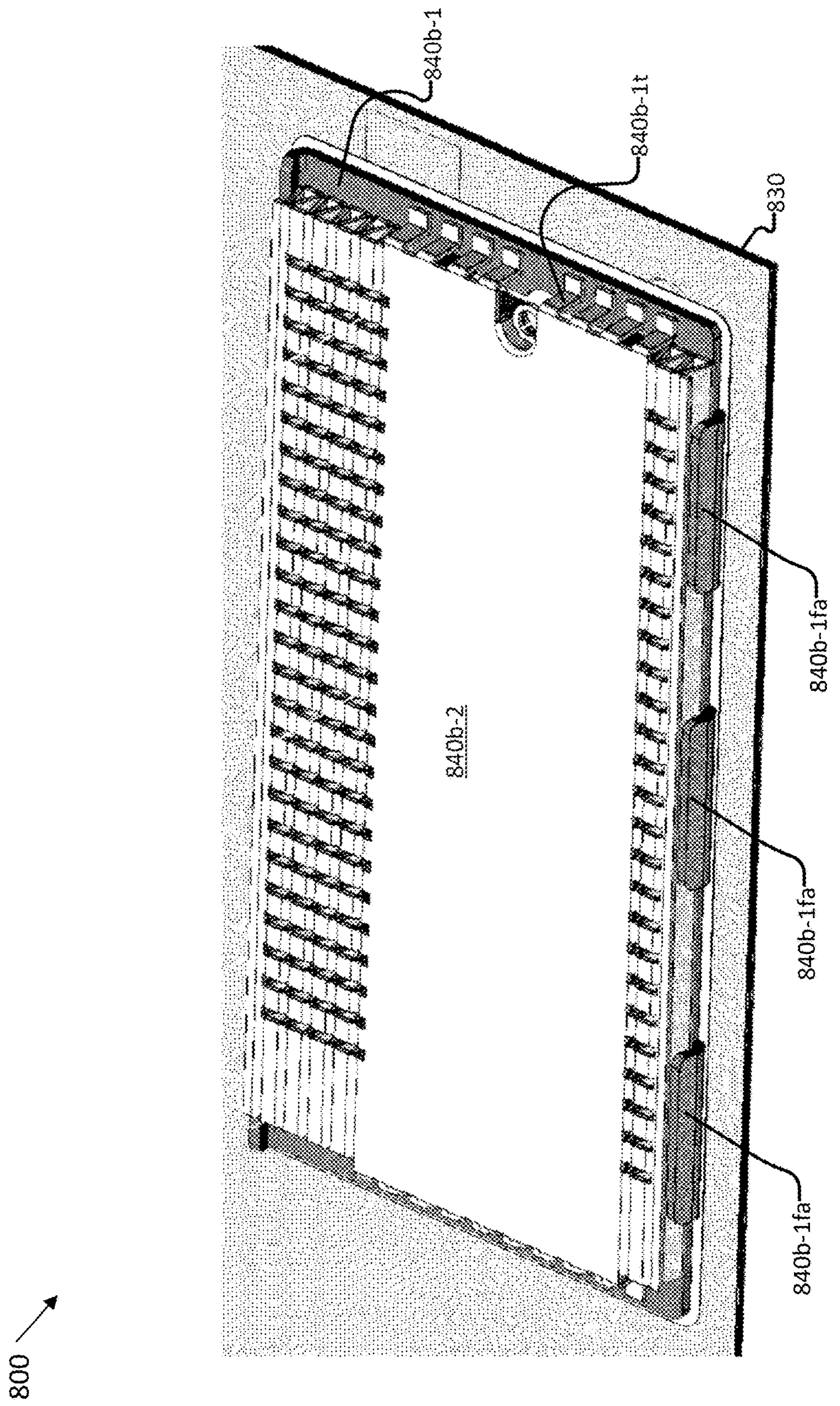
FIG. 8 shows a top angled view (similar to the exploded stack view of FIG. 6, but in this case non-exploded and from a top view) of a CAMM assembly that includes a CAMM and backplate assembly that accommodates a co-located component, where the backplate assembly includes a backplate and plate cap.

FIG. 8 shows a top angled view 800 (similar to the exploded stack view 600 of FIG. 6, but in this case non-exploded. and from a top view) of a CAMM assembly (which includes a CAMM (not shown) and backplate assembly 840*b* (which includes backplate 840*b*-1 and plate cap 840*b*-2)) mounted onto a PCB 830 and accommodating a co-located component under the plate cap 840*b*-2 (not shown) (e.g., an SSD). As shown in FIG. 8, the plate cap 840*b*-2 may have an electromagnetic interference (EMI) fencing that surrounds the co-located component, one tab of which is annotated in FIG. 8 as tab 840*b*-1*t*. The EMI fencing (formed by a number of tabs 840*b*-1*t*) may provide electromagnetic shielding for the co-located component to protect it from interference. The spacing between the tabs 840*b*-1*t* may provide airflow for thermal dissipation.

Figure 9:
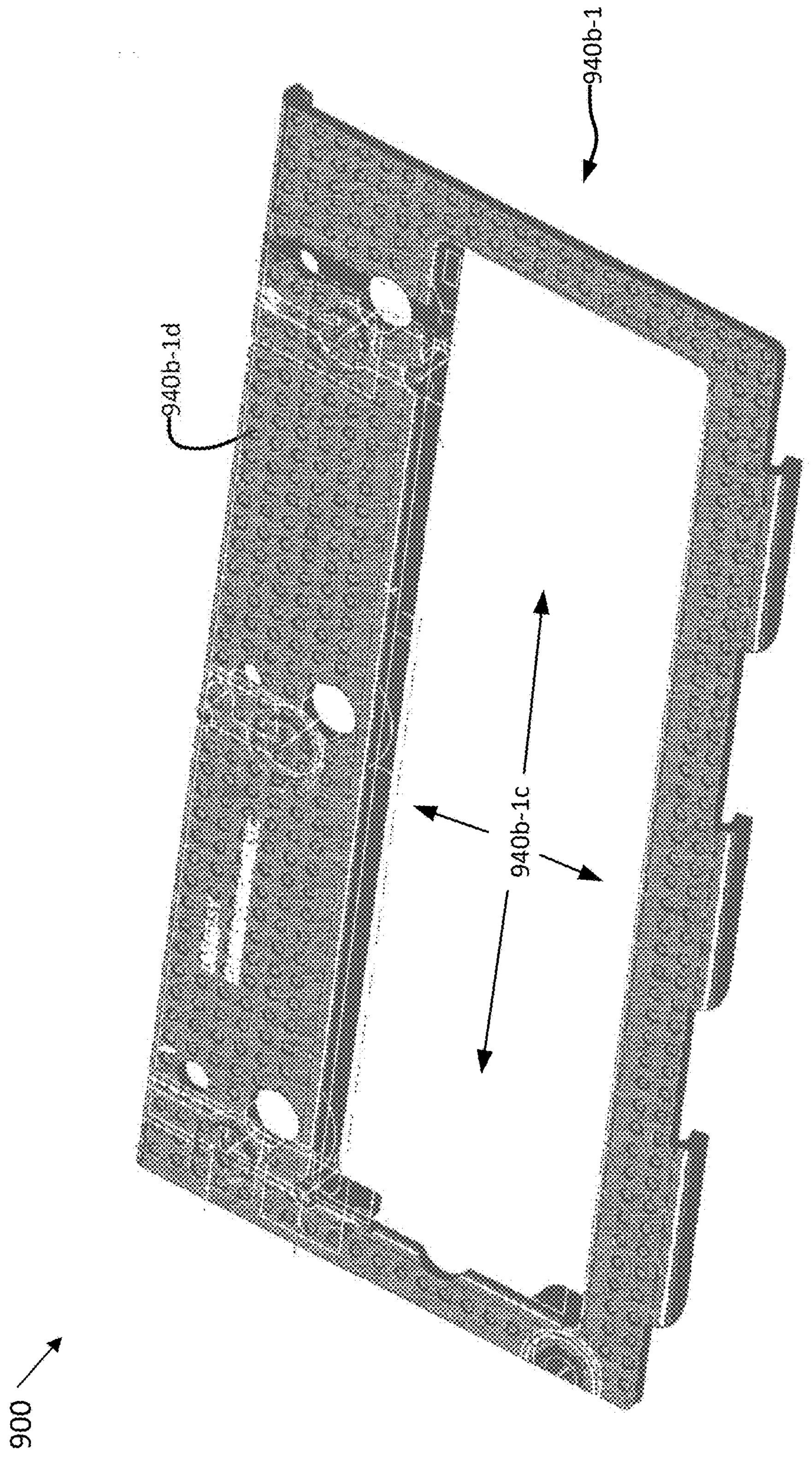
FIG. 9 shows a bottom angled view of a backplate that may accommodate a co-located component, where the bottom is of the side that would be mounted to the PCB.

FIG. 9 shows a bottom angled view 900 of a backplate 940*b*-1 (e.g., the side that is mounted to the PCB, similar to those backplates discussed above. Well seen in view 900 is the cutout 940*b*-1*c* that accommodates the additional component (such as an SSD) to be co-located with backplate 940*b*-1. In addition, backplate 940*b*-1 includes a dimpled surface on the backside, one round dimple 940*b*-1*d* of which is annotated, where the dimpled surface helps with thermal insulation between the backplate 940*b*-1 and the PCB to which it is mounted. While the dimpled surface includes regularly spaced round dimples 940*b*-1*d*, any size, shape, number, spacing, patterning, regularity, irregularity, distribution, and combinations of dimpling may be used to dimple the surface of backplate 940*b*-1. For example, gradients of increasing/decreasing dimples may be used and/or the dimples may be located only at designated "hot-spots," depending on desired thermal properties and structural needs of the backplate 940*b*-1*d*. Dimpling may reduce the effective surface area for heat transfer and may also create air pockets to serve as insulators between the backplate 940*b*-1*d* and the PCB to which it is mounted.

Figure 10:
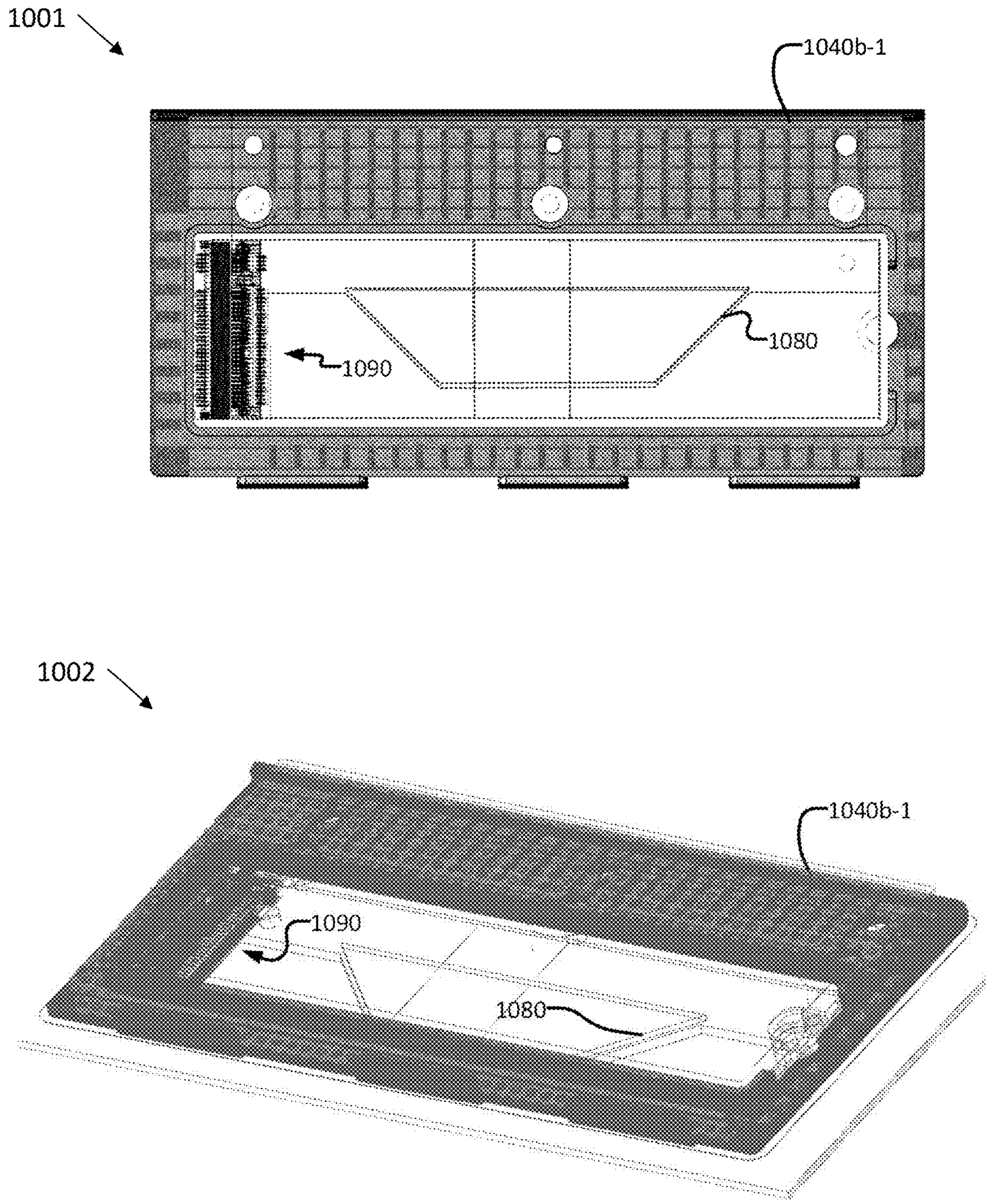
FIG. 10 shows a top view and angled top view of a wireframe of a conventional backplate overlaid with the improved backplate that may accommodate a co-located component.

FIG. 10 shows a top view 1001 of a wireframe of a conventional backplate 1080 overlaid with the improved backplate 1040*b*-1, as discussed above. FIG. 10 also shows an angled top view 1002 of a wireframe of a conventional backplate 1080 overlaid with the improved backplate 1040*b*-1, as discussed above. As can be seen, the improved 1040*b*-1 may have the mounting locations (e.g., screw bosses) for mounting the backplate to the CAMM, as discussed above, that are the same locations as the conventional backplate 1080, while still being able to accommodate an additional component within the cutout. As can also be seen in both views of FIG. 10, the connector 1090 for the additional component (e.g., an SSD) fits within the cutout of the backplate 1040*b*-1.

Figure 11:
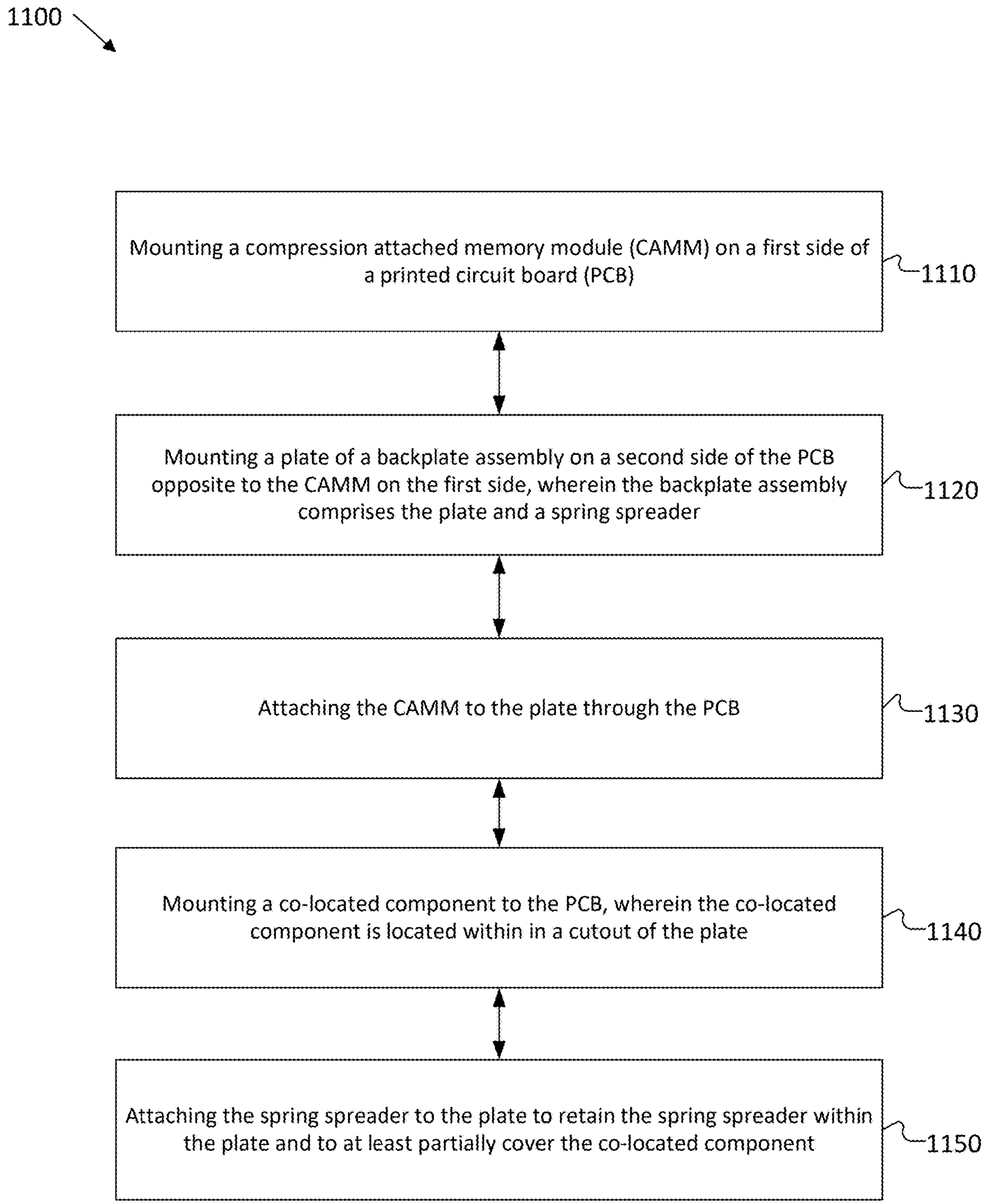
FIG. 11 depicts a schematic flow diagram of an exemplary method for attaching a CAMM through a PCB to a backplate assembly that accommodates a co-located component.

FIG. 11 depicts a schematic flow diagram of a method 1100 of attaching a compression attached memory module (CAMM) through a printed circuit board (PCB) to a backplate assembly that includes a plate and a spring spreader, wherein the backplate assembly accommodates a co-located component (e.g., an SSD). Method 1100 may implement any of the features discussed above with respect to the backplate assembly discussed above and/or with respect to FIGS. 1-10. Method 1100 includes, in 1110, mounting the CAMM on a first side of the PCB. Method 1100 also includes, in 1120, mounting the plate on a second side of the PCB that is opposite to the CAMM on the first side. Method 1100 also includes, in 1130, attaching the CAMM to the plate through the PCB. Method 1100 also includes, in 1130, mounting the co-located component to the PCB, where the co-located component is located within a cutout of the plate. Method 1100 also includes, in 1140, attaching the spring spreader to the plate to retain the spring spreader within the plate and to at least partially cover the co-located component.

In the following, various examples are provided that may include one or more features of the backplate assembly discussed above. It may be intended that aspects described in relation to the devices may apply also to the described method(s), and vice versa.

Example 1 is a mounting assembly including a backplate mounted on a first face of a printed circuit board and attached to a first component disposed on a second face of the printed circuit board opposite to the first face. The backplate also includes a cutout to receive an additional component. The backplate also includes a perimeter portion including a flange extending away from the backplate and the printed circuit board. The mounting assembly also includes a plate cap configured to engage with the flange to attach the plate cap to the backplate and to at least partially cover the additional component.

Example 2 is the mounting assembly of example 1, wherein the flange extends away from the first face of the backplate at an angle relative to a surface normal of the first face.

Example 3 is the mounting assembly of example 2, wherein the flange curves inwardly towards the cutout of the plate cap along the angle.

Example 4 is the mounting assembly of any one of examples 1 to 3, wherein the flange includes a curved wall configured to retain the plate cap by an engagement at the curved wall as between the flange and the plate cap.

Example 5 is the mounting assembly of any one of examples 1 to 4, wherein the backplate includes a metal backplate.

Example 6 is the mounting assembly of any one of examples 1 to 5, wherein the plate cap includes a snap-in heat spreader.

Example 7 is the mounting assembly of any one of examples 1 to 6, wherein the mounting assembly includes a compression attached memory module (CAMM).

Example 8 is the mounting assembly of any one of examples 1 to 7, wherein the additional component includes a solid state drive (SSD).

Example 9 is the mounting assembly of any one of examples 1 to 8, wherein the backplate is fixedly attached to the first component via a mounting screw that extends through the printed circuit board.

Example 10 is the mounting assembly of any one of examples 1 to 9, wherein the plate cap is resiliently deformable between a compressed state and an uncompressed state, wherein when engaged with the flange, the plate cap is in the compressed state.

Example 11 is the mounting assembly of example 10, wherein in the compressed state, the plate cap has a generally planar profile, where in in the uncompressed state, the plate cap is bent away from the generally planar profile.

Example 12 is the mounting assembly of any one of examples 1 to 11, wherein the plate cap is thermally conductive.

Example 13 is the mounting assembly of any one of examples 1 to 12, wherein the plate cap is configured to electromagnetically shield the additional component.

Example 14 is the mounting assembly of any one of examples 1 to 13, wherein the plate cap has a raised profile over the additional component, wherein the raised profile is configured to thermally contact the additional component.

Example 15 is the mounting assembly of example 14, wherein the plate cap has a raised profile over the additional component, wherein the plate cap has a series of spaced tabs that extend from the raised profile to the backplate, wherein the series of spaced tabs are configured to electromagnetically shield the additional component.

Example 16 is the mounting assembly of any one of examples 1 to 15, wherein the plate cap includes fins, looping or corrugation (e.g. for thermal dissipation).

Example 17 is the mounting assembly of any one of examples 1 to 16, wherein the plate cap is formed from a continuous sheet of material and includes contiguous open loops along at least a portion of the plate cap, wherein adjacent ones of the open loops open towards opposite faces of the plate cap.

Example 18 is the mounting assembly of example 17, wherein the open loops are generally U-shaped.

Example 19 is the mounting assembly of example 17, wherein the open loops are generally V-shaped.

Example 20 is the mounting assembly of example 17, wherein the open loops are generally C-shaped.

Example 21 is the mounting assembly of any one of examples 17 to 20, wherein the open loops are resiliently deformable between an open loop state and a closed loop state, wherein in the open loop state, open ends of each loop form an opening in the loop, wherein in the closed loop state, the open ends of each loop contact one another so as to close the opening.

Example 22 is the mounting assembly of example 21, wherein when engaged with the flange, the open loops are in the closed loop state.

Example 23 is the mounting assembly of any one of examples 17 to 22, wherein the open loops are arranged along a dimension to form a looped profile along a generally planar extent of the plate cap, wherein the open loops extend transverse to the looped profile.

Example 24 is the mounting assembly of any one of examples 1 to 23, the mounting assembly further including a thermal insulation sheet between the printed circuit board and the backplate.

Example 25 is the mounting assembly of any one of examples 1 to 24, wherein a portion of a surface of the backplate includes a dimpled surface.

Example 26 is the mounting assembly of example 25, wherein the dimpled surface is facing towards the printed circuit board.

Example 27 is the mounting assembly of any one of examples 25 to 26, wherein dimples of the dimpled surface are round.

Example 28 is the mounting assembly of any one of examples 25 to 27, wherein dimples of the dimpled surface are irregularly spaced with respect to one another.

Example 29 is the mounting assembly of any one of examples 25 to 28, wherein dimples of the dimpled surface are regularly spaced with respect to one another.

Example 30 is a backplate assembly for attaching to a compression attached memory module (CAMM) through a printed circuit board, wherein the backplate assembly receives a co-located solid state drive (SSD). The backplate assembly includes a plate mounted to a second face of the printed circuit board that is opposite to the CAMM, wherein the CAMM is attached to a first face opposite to the second face. The plate includes a cutout to receive the co-located SSD. The plate also includes a perimeter portion that includes a flange extending away from the plate and the printed circuit board. The backplate assembly also includes a spring spreader configured to engage with the flange to retain the spring spreader onto the plate and to at least partially cover the co-located SSD.

Example 31 is the backplate assembly of example 30, wherein the flange extends away from the opposite face of the plate at an angle relative to a surface normal of the printed circuit board.

Example 32 is the backplate assembly of example 31, wherein the flange curves inwardly towards the cutout of the spring spreader along the angle.

Example 33 is the backplate assembly of any one of examples 30 to 32, wherein the flange includes a curved wall configured to retain the spring spreader by an engagement at the curved wall as between the flange and the spring spreader.

Example 34 is the backplate assembly of any one of examples 30 to 33, wherein the plate includes a metal plate.

Example 35 is the backplate assembly of any one of examples 30 to 34, wherein the spring spreader includes a snap-in heat spreader.

Example 36 is the backplate assembly of any one of examples 30 to 35, wherein the plate is fixedly attached to the first component via a mounting screw that extends through the printed circuit board.

Example 37 is the backplate assembly of any one of examples 30 to 36, wherein the spring spreader is resiliently deformable between a compressed state and an uncompressed state, wherein when engaged with the flange, the spring spreader is in the compressed state.

Example 38 is the backplate assembly of example 37, wherein in the compressed state, the spring spreader has a generally planar profile, where in in the uncompressed state, the spring spreader is bent away from the generally planar profile.

Example 39 is the backplate assembly of any one of examples 30 to 38, wherein the spring spreader is thermally conductive.

Example 40 is the backplate assembly of any one of examples 30 to 39, wherein the spring spreader is configured to electromagnetically shield the co-located SSD.

Example 41 is the backplate assembly of any one of examples 30 to 40, wherein the spring spreader has a raised profile over the co-located SSD, wherein the raised profile is configured to thermally contact the co-located SSD.

Example 42 is the backplate assembly of example 41, wherein the spring spreader has a raised profile over the co-located SSD, wherein the spring spreader has a series of spaced tabs that extend from the raised profile to the plate, wherein the series of spaced tabs are configured to electromagnetically shield the co-located SSD.

Example 43 is the backplate assembly of any one of examples 30 to 42, wherein the spring spreader includes fins, looping or corrugation (e.g. for thermal dissipation).

Example 44 is the backplate assembly of any one of examples 30 to 43, wherein the spring spreader is formed from a continuous sheet of material and includes contiguous open loops along at least a portion of the spring spreader, wherein adjacent ones of the open loops open towards opposite faces of the spring spreader.

Example 45 is the backplate assembly of example 44, wherein the open loops are generally U-shaped.

Example 46 is the backplate assembly of example 44, wherein the open loops are generally V-shaped.

Example 47 is the backplate assembly of example 44, wherein the open loops are generally C-shaped.

Example 48 is the backplate assembly of any one of examples 44 to 47, wherein the open loops are resiliently deformable between an open loop state and a closed loop state, wherein in the open loop state, open ends of each loop form an opening in the loop, wherein in the closed loop state, the open ends of each loop contact one another so as to close the opening.

Example 49 is the backplate assembly of example 48, wherein when engaged with the flange, the open loops are in the closed loop state.

Example 50 is the backplate assembly of any one of examples 44 to 49, wherein the open loops are arranged along a dimension to form a looped profile along a generally planar extent of the spring spreader, wherein the open loops extend transverse to the looped profile.

Example 51 is the backplate assembly of any one of examples 30 to 50, the backplate assembly further including a thermal insulation sheet between the printed circuit board and the plate.

Example 52 is the backplate assembly of any one of examples 30 to 51, wherein a portion of a surface of the plate includes a dimpled surface.

Example 53 is the backplate assembly of example 52, wherein the dimpled surface is facing towards the printed circuit board.

Example 54 is the backplate assembly of any one of examples 52 to 53, wherein dimples of the dimpled surface are round.

Example 55 is the backplate assembly of any one of examples 52 to 54, wherein dimples of the dimpled surface are irregularly spaced with respect to one another.

Example 56 is the backplate assembly of any one of examples 52 to 55, wherein dimples of the dimpled surface are regularly spaced with respect to one another.

Example 57 is a method of attaching a compression attached memory module (CAMM) through a printed circuit board (PCB) to a backplate assembly that includes a plate and a spring spreader, wherein the backplate assembly accommodates a co-located component. The method includes mounting the CAMM on one side (first side) of the PCB and the plate on an opposite side (second side, opposite to the first side) of the PCB. The method also includes attaching the CAMM to the plate through the PCB. The method also includes mounting the co-located component to the PCB, where the co-located component is located within a cutout of the plate. The method also includes attaching the spring spreader to the plate to retain the spring spreader within the plate and to at least partially cover the co-located component.

Example 58 is the method of example 57, wherein attaching the spring spreader to the plate includes engaging the spring spreader with a flange of the plate, wherein the flange extends away from a face of the backplate at an angle relative to a surface normal of the face.

Example 59 is the method of example 58, wherein the flange curves inwardly towards the cutout of the plate along the angle.

Example 60 is the method of any one of examples 59 to 59, wherein the flange includes a curved wall configured to retain the spring spreader by an engagement at the curved wall as between the flange and the spring spreader.

Example 61 is the method of any one of examples 57 to 60, wherein the plate includes a metal backplate.

Example 62 is the method of any one of examples 57 to 61, wherein the spring spreader includes a snap-in heat spreader.

Example 63 is the method of any one of examples 57 to 62, wherein the co-located component includes a solid state drive (SSD).

Example 64 is the method of any one of examples 57 to 63, the method including fixedly attaching the plate to the CAMM via a mounting screw that extends through the PCB.

Example 65 is the method of any one of examples 57 to 64, wherein the spring spreader is resiliently deformable between a compressed state and an uncompressed state, wherein attaching the spring spreader to the plate includes putting the spring spreader into the compressed state.

Example 66 is the method of example 65, wherein in the compressed state, the spring spreader has a generally planar profile, wherein in the uncompressed state, the spring spreader is bent away from the generally planar profile.

Example 67 is the method of any one of examples 57 to 66, wherein the spring spreader is thermally conductive.

Example 68 is the method of any one of examples 57 to 67, wherein the spring spreader is configured to electromagnetically shield the co-located component.

Example 69 is the method of any one of examples 57 to 68, wherein the spring spreader has a raised profile over the co-located component, wherein the raised profile is configured to thermally contact the co-located component.

Example 70 is the method of example 69, wherein the spring spreader has a raised profile over the co-located component, wherein the spring spreader has a series of spaced tabs that extend from the raised profile to the plate, wherein the series of spaced tabs are configured to electromagnetically shield the co-located component.

Example 71 is the method of any one of examples 57 to 70, wherein the spring spreader includes fins, looping or corrugation (e.g. for thermal dissipation).

Example 72 is the method of any one of examples 57 to 71, the method further including forming the spring spreader from a continuous sheet of material, wherein the spring spreader is formed into contiguous open loops along at least a portion of the spring spreader, wherein adjacent ones of the open loops open towards opposite faces of the spring spreader.

Example 73 is the method of example 72, wherein the open loops are generally U-shaped.

Example 74 is the method of example 72, wherein the open loops are generally V-shaped.

Example 75 is the method of example 72, wherein the open loops are generally C-shaped.

Example 76 is the method of any one of examples 72 to 75, wherein the open loops are resiliently deformable between an open loop state and a closed loop state, wherein in the open loop state, open ends of each loop form an opening in the loop, wherein in the closed loop state, the open ends of each loop contact one another so as to close the opening.

Example 77 is the method of example 76, wherein attaching the spring spreader to the plate includes putting the open loops into the closed loop state.

Example 78 is the method of any one of examples 72 to 77, wherein the open loops are arranged along a dimension to form a looped profile along a generally planar extent of the spring spreader, wherein the open loops extend transverse to the looped profile.

Example 79 is the method of any one of examples 57 to 78, the method further including providing a thermal insulation sheet between the PCB and the plate.

Example 80 is the method of any one of examples 57 to 79, wherein a portion of a surface of the plate includes a dimpled surface.

Example 81 is the method of example 80, wherein the dimpled surface is facing towards the PCB.

Example 82 is the method of any one of examples 80 to 81, wherein dimples of the dimpled surface are round.

Example 83 is the method of any one of examples 80 to 82, wherein dimples of the dimpled surface are irregularly spaced with respect to one another.

Example 84 is the method of any one of examples 80 to 83, wherein dimples of the dimpled surface are regularly spaced with respect to one another.

Example While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

The invention claimed is:

1. A device comprising:

a backplate mounted on a first face of a printed circuit board and attached to a first component disposed on a second face of the printed circuit board opposite to the first face, the backplate comprising:

a cutout to receive an additional component; and a perimeter portion comprising a flange extending away from the backplate and the printed circuit board; and a plate cap configured to engage with the flange to attach the plate cap to the backplate and to at least partially cover the additional component, wherein the plate cap has a raised profile over the additional component, wherein the plate cap comprises a series of spaced tabs that extend from the raised profile to the backplate, wherein the series of spaced tabs are configured to electromagnetically shield the additional component.

2. The device of claim 1, wherein a portion of the flange extends away from the first face of the backplate at an angle relative to a surface normal of the first face.

3. The device of claim 1, wherein the flange comprises a curved wall configured to retain the plate cap by an engagement at the curved wall as between the flange and the plate cap.

4. The device of claim 1, wherein the device comprises a compression attached memory module (CAMM) and wherein the additional component comprises a solid state drive (SSD).

5. The device of claim 1, wherein the backplate is fixedly attached to the first component via a mounting screw that extends through the printed circuit board.

6. The device of claim 1, wherein the plate cap is resiliently deformable between a compressed state and an uncompressed state, wherein when engaged with the flange, the plate cap is in the compressed state.

7. The device of claim 1, wherein the plate cap is thermally conductive and has a raised profile over the additional component, wherein the raised profile thermally contacts the additional component.

8. The device of claim 1, wherein the plate cap comprises fins, looping or corrugation.

9. The device of claim 1, wherein the plate cap is formed from a continuous sheet of material and comprises contiguous open loops along at least a portion of the plate cap, wherein adjacent ones of the open loops open towards opposite faces of the plate cap.

10. The device of claim 2, wherein a portion of the flange curves inwardly towards the cutout of the plate cap along the angle.

11. The device of claim 6, wherein in the compressed state, the plate cap has a generally planar profile, where in in the uncompressed state, the plate cap is bent away from the generally planar profile.

12. The device of claim 9, wherein one or more of the open loops are generally U-shaped, V-shaped, or C-shaped.

13. The device of claim 9, wherein the open loops are resiliently deformable between an open loop state and a closed loop state, wherein in the open loop state, open ends of each loop form an opening in the loop, wherein in the closed loop state, the open ends of each loop contact one another so as to close the opening.

14. The device of claim 13, wherein when engaged with the flange, the open loops are in the closed loop state.

15. The device of claim 9, wherein the open loops are arranged along a dimension to form a looped profile along a generally planar extent of the plate cap, wherein the open loops extend transverse to the looped profile.

16. A backplate assembly comprising:

a compression attached memory module (CAMM) disposed on a first face of a printed circuit board;

a plate mounted to a second face of the printed circuit board that is opposite to the first face, wherein the plate is attached to the compression attached memory module (CAMM) through the printed circuit board, the plate comprising:

a cutout to receive a co-located solid state drive (SSD); and a perimeter portion comprising a flange extending away from the plate and the printed circuit board; and a spring spreader configured to engage with the flange to retain the spring spreader onto the plate and to at least partially cover the co-located SSD.

17. The backplate assembly of claim 16, wherein a portion of a surface of the plate comprises a dimpled surface facing towards the printed circuit board.

18. A method for mounting components on a printed circuit board (PCB), the method comprising:

mounting a compression attached memory module (CAMM) on a first side of the PCB;

mounting a plate of a backplate assembly on a second side of the PCB opposite to the CAMM on the first side, wherein the backplate assembly comprises the plate and a spring spreader;

attaching the CAMM to the plate through the PCB;

mounting a co-located component to the PCB, wherein the co-located component is located within a cutout of the plate; and attaching the spring spreader to the plate so that the plate retains the spring spreader and at least partially covers the co-located component.

19. The method of claim 18, wherein the attaching the spring spreader to the plate comprises snapping the spring spreader into a raised flange of the plate, wherein the raised flange engages with fins, loops, or corrugations of the spring spreader to retain the spring spreader on the plate.

* * * * *